United States Patent
Thothadri et al.

(10) Patent No.: US 11,988,810 B2
(45) Date of Patent: May 21, 2024

(54) MULTI-LAYER WET-DRY HARDCOATS FOR FLEXIBLE COVER LENS

(71) Applicant: Applied Materials, Inc., Santa Clara, CA (US)

(72) Inventors: Manivannan Thothadri, Mountain View, CA (US); Harvey You, Mountain View, CA (US); Neil Morrison, Seeheim-Jugenheim (DE); Daniel Paul Forster, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/505,627

(22) Filed: Jul. 8, 2019

(65) Prior Publication Data
US 2020/0057178 A1 Feb. 20, 2020

Related U.S. Application Data

(60) Provisional application No. 62/718,931, filed on Aug. 14, 2018.

(51) Int. Cl.
*G02B 1/14* (2015.01)
*G02B 1/18* (2015.01)
(Continued)

(52) U.S. Cl.
CPC .............. *G02B 1/14* (2015.01); *G02B 1/18* (2015.01); *H10K 50/844* (2023.02);
(Continued)

(58) Field of Classification Search
CPC . G02B 1/14; H01L 51/5253; B32B 2307/412; B32B 2457/20–208
See application file for complete search history.

(56) References Cited

U.S. PATENT DOCUMENTS 6,512,512 B1  1/2003  Blanchard
6,660,388 B2  12/2003  Liu et al.
(Continued)

FOREIGN PATENT DOCUMENTS

CN  1928637 A  3/2007
CN  1950723 A  4/2007
(Continued)

OTHER PUBLICATIONS

Day-Shan Liu et al: "Adhesion enhancement of hard coatings deposited on flexible plastic substrates using an interfacial buffer layer", Journal of Physics D: Applied Physics, Institute of Physics Publishing Ltd, GB, vol. 43, No. 17, May 5, 2010 (May 5, 2019), p. 175301, XP020171087, ISSN: 0022-3727 Experiment; table 1.
(Continued)

*Primary Examiner* — Jasper Saberi
(74) *Attorney, Agent, or Firm* — Patterson + Sheridan, LLP (57) ABSTRACT

Implementations described herein generally relate to flexible display devices, and more specifically to flexible cover lens films. The flexible cover lens film has improved strength, elasticity, optical transmission, and anti-abrasion properties. The flexible cover lens film comprises a multi-layer hardcoat disposed on a substrate layer. The substrate layer has a thickness between 2 µm to 100 µm, and the multi-layer hardcoat has a thickness between 1 µm to 10 µm. The multi-layer hardcoat comprises a first layer deposited using a wet deposition process, a second layer deposited using a dry deposition process, and one or more adhesion promotion layers. In terms of optical properties, the multi-layer hardcoat has a total transmission greater than 88%, a haze of about 1% or less, and a yellowness index of b*<1. By combining wet and dry deposition processes to form the
(Continued)

multi-layer hardcoat, the cover lens film is both flexible and strong with hardness between 4 H and 9 H.

14 Claims, 5 Drawing Sheets

(51) Int. Cl.
*H10K 50/844* (2023.01)
*H10K 102/00* (2023.01)

(52) U.S. Cl.
CPC ... *B32B 2307/412* (2013.01); *B32B 2457/208* (2013.01); *H10K 2102/311* (2023.02)

(56) References Cited

U.S. PATENT DOCUMENTS

| | | | |
|---|---|---|---|
| 6,781,642 | B2 | 8/2004 | Nakanishi et al. |
| 6,841,190 | B2 | 1/2005 | Liu et al. |
| 6,872,114 | B2 | 3/2005 | Chung et al. |
| 7,071,927 | B2 | 7/2006 | Blanchard |
| 7,326,313 | B2 | 2/2008 | Lee et al. |
| 7,342,080 | B2 | 3/2008 | Qiu et al. |
| 7,880,967 | B2 | 2/2011 | Taketomo et al. |
| 8,580,378 | B2 | 11/2013 | Noguchi |
| 8,618,531 | B2 | 12/2013 | Alden et al. |
| 8,693,099 | B2 | 4/2014 | Kawashima et al. |
| 9,023,162 | B2 | 5/2015 | McCormick et al. |
| 9,475,947 | B2 | 10/2016 | Sirois |
| 10,034,395 | B2 | 7/2018 | Shin |
| 10,096,792 | B2 | 10/2018 | Ahn et al. |
| 10,211,421 | B2 | 2/2019 | Lee et al. |
| 10,237,989 | B1 | 3/2019 | Peters et al. |
| 10,241,377 | B1 | 3/2019 | Wang et al. |
| 10,545,537 | B2 | 1/2020 | Ahn et al. |
| 10,566,570 | B2 | 2/2020 | Bu et al. |
| 10,632,711 | B2 | 4/2020 | Lee et al. |
| 10,752,808 | B2 | 8/2020 | Ono |
| 2002/0114934 | A1 | 8/2002 | Liu et al. |
| 2002/0122925 | A1 | 9/2002 | Liu et al. |
| 2005/0249944 | A1 | 11/2005 | Wang et al. |
| 2006/0275950 | A1 | 12/2006 | Lee |
| 2007/0196633 | A1* | 8/2007 | Coak ............... B05D 1/62 428/215 |
| 2008/0047468 | A1 | 2/2008 | de Rojas |
| 2008/0241524 | A1 | 10/2008 | Fukuda et al. |
| 2008/0311351 | A1 | 12/2008 | Hsu et al. |
| 2009/0130472 | A1 | 5/2009 | Kondo et al. |
| 2009/0311539 | A1 | 12/2009 | Larson-Smith et al. |
| 2010/0028608 | A1 | 2/2010 | Choi et al. |
| 2010/0118406 | A1 | 5/2010 | Kobori et al. |
| 2010/0330359 | A1 | 12/2010 | Ishikawa et al. |
| 2013/0122230 | A1 | 5/2013 | Tsai et al. |
| 2013/0236713 | A1 | 9/2013 | Park et al. |
| 2014/0147662 | A1 | 5/2014 | Ishikawa et al. |
| 2014/0322471 | A1 | 10/2014 | Liu et al. |
| 2014/0322472 | A1 | 10/2014 | McCormick et al. |
| 2015/0109234 | A1 | 4/2015 | Lotz et al. |
| 2015/0125679 | A1 | 5/2015 | Ishikawa |
| 2015/0167170 | A1 | 6/2015 | Ranade et al. |
| 2015/0266272 | A1 | 9/2015 | Lee et al. |
| 2015/0275040 | A1 | 10/2015 | Shi et al. |
| 2016/0024348 | A1 | 1/2016 | Kim et al. |
| 2016/0208130 | A1 | 7/2016 | Ishikawa et al. |
| 2016/0306392 | A1 | 10/2016 | Park |
| 2016/0372701 | A1 | 12/2016 | Kwon et al. |
| 2017/0095993 | A1* | 4/2017 | Tomomatsu ........... B32B 27/16 |
| 2017/0170416 | A1 | 6/2017 | Johnson et al. |
| 2017/0183257 | A1 | 6/2017 | Apitz et al. |
| 2017/0183462 | A1 | 6/2017 | Song et al. |
| 2017/0217143 | A1 | 8/2017 | Kim et al. |
| 2017/0276840 | A1* | 9/2017 | Horio ............... B32B 27/281 |
| 2018/0196169 | A1* | 7/2018 | Choi ................. C09D 133/08 |
| 2018/0265731 | A1* | 9/2018 | Ekinaka ............ C09D 133/12 |
| 2018/0294441 | A1* | 10/2018 | Brotzman ............. B32B 27/08 |
| 2018/0346760 | A1 | 12/2018 | Kim et al. |
| 2018/0372921 | A1* | 12/2018 | Washio ................ C09D 7/40 |
| 2019/0086760 | A1 | 3/2019 | Wang et al. |
| 2019/0131571 | A1 | 5/2019 | Thothadri et al. |
| 2019/0293921 | A1 | 9/2019 | Nam et al. |
| 2019/0315105 | A1* | 10/2019 | Isojima ................ G09F 9/30 |
| 2019/0377105 | A1 | 12/2019 | Lim et al. |
| 2019/0383973 | A1* | 12/2019 | Jang .................. G02B 1/14 |
| 2020/0020256 | A1 | 1/2020 | Spiro et al. |
| 2020/0057178 | A1 | 2/2020 | Thothadri et al. |
| 2020/0081162 | A1 | 3/2020 | Park et al. |
| 2020/0095469 | A1 | 3/2020 | Yu et al. |
| 2020/0123410 | A1 | 4/2020 | Reit et al. |
| 2020/0243798 | A1* | 7/2020 | Matsushita ......... H01L 51/5281 |

FOREIGN PATENT DOCUMENTS

| | | |
|---|---|---|
| CN | 100549064 C | 10/2009 |
| CN | 101616964 A | 12/2009 |
| CN | 101874211 A | 10/2010 |
| CN | 102686527 A | 9/2012 |
| CN | 103085365 A | 5/2013 |
| CN | 103135159 A | 6/2013 |
| CN | 103677400 A | 3/2014 |
| CN | 104640911 A | 5/2015 |
| CN | 104765178 A | 7/2015 |
| CN | 104918780 A | 9/2015 |
| CN | 104284776 B | 1/2016 |
| CN | 106023810 A | 10/2016 |
| CN | 106232344 A | 12/2016 |
| CN | 106992221 A | 7/2017 |
| CN | 106992253 A | 7/2017 |
| CN | 106992254 A | 7/2017 |
| CN | 106992255 A | 7/2017 |
| CN | 107073886 A | 8/2017 |
| CN | 107305756 A | 10/2017 |
| CN | 107405901 A | 11/2017 |
| CN | 107450784 A | 12/2017 |
| CN | 107452891 A | 12/2017 |
| CN | 107799574 A | 3/2018 |
| CN | 107919436 A | 4/2018 |
| CN | 108292005 A | 7/2018 |
| CN | 207817243 U | 9/2018 |
| CN | 108807463 A | 11/2018 |
| CN | 109326218 A | 2/2019 |
| CN | 109427990 A | 3/2019 |
| CN | 109642964 A | 4/2019 |
| CN | 109659332 A | 4/2019 |
| CN | 109659333 A | 4/2019 |
| CN | 109669827 A | 4/2019 |
| CN | 209102942 U | 7/2019 |
| CN | 110085138 A | 8/2019 |
| CN | 110531897 A | 12/2019 |
| CN | 110669423 A | 1/2020 |
| CN | 209509544 U | 1/2020 |
| CN | 209992964 U | 1/2020 |
| CN | 110782785 A | 2/2020 |
| CN | 110783389 A | 2/2020 |
| CN | 111051052 A | 4/2020 |
| CN | 107615103 B | 12/2020 |
| EP | 1632541 A1 | 3/2006 |
| EP | 2329888 A2 | 6/2011 |
| EP | 2981413 A1 | 2/2016 |
| EP | 2180354 B1 | 8/2017 |
| EP | 3327731 A1 | 5/2018 |
| EP | 3429845 A1 | 1/2019 |
| EP | 3417360 B1 | 9/2019 |
| EP | 3633004 A1 | 4/2020 |
| JP | H06331804 A | 12/1994 |
| JP | 3411009 B2 | 5/2003 |
| JP | 2003266587 A | 9/2003 |
| JP | 3565929 B2 | 9/2004 |
| JP | 3615171 B2 | 1/2005 |
| JP | 2005017544 A | 1/2005 |
| JP | 2005055724 A | 3/2005 |
| JP | 2005144719 A | 6/2005 |
| JP | 2005178176 A | 7/2005 |
| JP | 2005280131 A | 10/2005 |
| JP | 2005289041 A | 10/2005 |

(56) References Cited

FOREIGN PATENT DOCUMENTS

| | | |
|---|---|---|
| JP | 3751922 B2 | 3/2006 |
| JP | 2006071982 A | 3/2006 |
| JP | 2006155452 A | 6/2006 |
| JP | 3802842 B2 | 7/2006 |
| JP | 2007025077 A | 2/2007 |
| JP | 3942039 B2 | 7/2007 |
| JP | 2007216435 A | 8/2007 |
| JP | 2008110550 A | 5/2008 |
| JP | 2008275737 A | 11/2008 |
| JP | 2010000753 A | 1/2010 |
| JP | 2010515783 A | 5/2010 |
| JP | 2010524716 A | 7/2010 |
| JP | 4793056 B2 | 10/2011 |
| JP | 5201369 B2 | 6/2013 |
| JP | 2013107382 A * | 6/2013 |
| JP | 5296410 B2 | 9/2013 |
| JP | 5518374 B2 | 6/2014 |
| JP | 2015003510 A | 1/2015 |
| JP | 201587625 A | 5/2015 |
| JP | 2015182272 A | 10/2015 |
| JP | 2017013492 A | 1/2017 |
| JP | 2017126620 A | 7/2017 |
| JP | 6207679 B2 | 10/2017 |
| JP | 2018109773 A | 7/2018 |
| JP | 2018159913 A | 10/2018 |
| JP | 2018180274 A | 11/2018 |
| JP | 6532929 B2 | 6/2019 |
| JP | 6542970 B2 | 7/2019 |
| JP | 6787673 B2 | 11/2020 |
| KR | 100550377 B1 | 2/2006 |
| KR | 20080034534 A | 4/2008 |
| KR | 20140122385 A | 10/2014 |
| KR | 20160071174 A | 6/2016 |
| KR | 20160095308 A | 8/2016 |
| KR | 20160103681 A | 9/2016 |
| KR | 20170001102 A | 1/2017 |
| KR | 20170019840 A | 2/2017 |
| KR | 20170019865 A | 2/2017 |
| KR | 20170021033 A | 2/2017 |
| KR | 20170041368 A | 4/2017 |
| KR | 20170041369 A | 4/2017 |
| KR | 20170051909 A | 5/2017 |
| KR | 20170051911 A | 5/2017 |
| KR | 20170059158 A | 5/2017 |
| KR | 20170075663 A | 7/2017 |
| KR | 20170078159 A | 7/2017 |
| KR | 20170097381 A | 8/2017 |
| KR | 20170097401 A | 8/2017 |
| KR | 20170103395 A | 9/2017 |
| KR | 20170103644 A | 9/2017 |
| KR | 101788596 B1 | 10/2017 |
| KR | 20170136033 A | 12/2017 |
| KR | 20180001175 A | 1/2018 |
| KR | 101854524 B1 | 5/2018 |
| KR | 20180067864 A | 6/2018 |
| KR | 20180067865 A | 6/2018 |
| KR | 20180073987 A | 7/2018 |
| KR | 20180074544 A | 7/2018 |
| KR | 20180083171 A | 7/2018 |
| KR | 20180093649 A | 8/2018 |
| KR | 20180096996 A | 8/2018 |
| KR | 101938413 B1 | 1/2019 |
| KR | 101948655 B1 | 2/2019 |
| KR | 20190030912 A | 3/2019 |
| KR | 101971832 B1 | 4/2019 |
| KR | 20190039465 A | 4/2019 |
| KR | 20190039466 A | 4/2019 |
| KR | 20190043427 A | 4/2019 |
| KR | 20190043428 A | 4/2019 |
| KR | 20190044267 A | 4/2019 |
| KR | 20190044360 A | 4/2019 |
| KR | 20190060463 A | 6/2019 |
| KR | 20190081823 A | 7/2019 |
| KR | 102009962 B1 | 8/2019 |
| KR | 102017142 B1 | 9/2019 |
| KR | 20190104565 A | 9/2019 |
| KR | 20190109024 A | 9/2019 |
| KR | 20190109113 A | 9/2019 |
| KR | 102031275 B1 | 10/2019 |
| KR | 102039737 B1 | 11/2019 |
| KR | 102043333 B1 | 11/2019 |
| KR | 102047504 B1 | 11/2019 |
| KR | 102047512 B1 | 11/2019 |
| KR | 20190128557 A | 11/2019 |
| KR | 20190130490 A | 11/2019 |
| KR | 102060541 B1 | 12/2019 |
| KR | 20200003266 A | 1/2020 |
| KR | 102076281 B1 | 2/2020 |
| KR | 20200021406 A | 2/2020 |
| KR | 20200021407 A | 2/2020 |
| KR | 102088674 B1 | 3/2020 |
| KR | 20200022168 A | 3/2020 |
| KR | 20200025036 A | 3/2020 |
| KR | 20200025472 A | 3/2020 |
| KR | 20200030663 A | 3/2020 |
| KR | 20200041042 A | 4/2020 |
| TW | 201500433 A | 1/2015 |
| TW | I760556 B | 4/2022 |
| WO | 2009041533 A1 | 4/2009 |
| WO | 2012090665 A1 | 7/2012 |
| WO | 2014163352 A1 | 10/2014 |
| WO | 2016208785 A1 | 12/2016 |
| WO | 2017051914 A1 | 3/2017 |
| WO | WO-2017051914 A1 * | 3/2017 ............ C23C 16/42 |
| WO | 2017073903 A1 | 5/2017 |
| WO | 2017116103 A1 | 7/2017 |
| WO | 2018070523 A1 | 4/2018 |
| WO | 2018130289 A1 | 7/2018 |
| WO | 2018159918 A1 | 9/2018 |
| WO | 2018186262 A1 | 10/2018 |
| WO | 2018230495 A1 | 12/2018 |
| WO | 2019083606 A1 | 5/2019 |
| WO | 2019085486 A1 | 5/2019 |
| WO | 2019147915 A1 | 8/2019 |
| WO | 2019168005 A1 | 9/2019 |
| WO | 2019217565 A1 | 11/2019 |
| WO | 2019237254 A1 | 12/2019 |

OTHER PUBLICATIONS

Kuhr M et al: "Coatings on plastics with the PICVD technology", Thin Solid F, Elsevier, Amsterdam, NL, vol. 442, No. 1-2, Sep. 17, 2003 (Sep. 17, 2003), pp. 107-116, XP004458307, ISSN: 0040-6090, DOI: 10.1016/S0040-6090(03)00956-8 Experimental.
PCT International Search Report/Written Opinion dated Dec. 12, 2018 for Application No. PCT/US2018/048391.
International Search Report and the Written Opinion for International Application No. PCT/US2019/040402 dated Oct. 18, 2019.
International Search Report and Written Opinion dated Sep. 29, 2020 for Application No. PCT/US2020/037949.
International Search Report and Written Opinion dated Sep. 29, 2020 for Application No. PCT/US2020/037952.
International Search Report and Written Opinion dated Sep. 29, 2020 for Application No. PCT/US2020/037956.
International Search Report and Written Opinion dated Sep. 29, 2020 for Application No. PCT/US2020/037958.
International Search Report and Written Opinion dated Aug. 28, 2019 for Application No. PCT/US2019/031337.
Taiwanese Office Action and Search Report for TW Application No. 108123820 dated Jul. 30, 2020.
Taiwan Office Action dated Aug. 27, 2020 for Application No. 108116194.
Japanese Office Action dated Nov. 16, 2021 for Application No. 2020-522838.
Japanese Office Action dated Jan. 4, 2022 for Application No. 2020-563552.
Chinese Office Action dated Mar. 2, 2022 for Application No. 201880069545.4.
Japanese Office Action dated Mar. 15, 2022 for Application No. 2020-522838.

(56) References Cited

OTHER PUBLICATIONS

Chinese Office Action dated Apr. 27, 2022 for Application No. 201980029310.7.
Korean Office Action dated Jun. 22, 2022 for Application No. 10-2020-7035352.
Chinese Office Action dated May 31, 2022 for Application No. 201880069545.4.
Japanese Office Action dated Aug. 2, 2022 for Application No. 2020-563552.
Chinese Application No. 201980055267.1, Office Action and Search Report dated Aug. 31, 2022, 14 pages.
Taiwan Office Action dated Sep. 6, 2022 for Application No. 109120632.
Chinese Office Action dated Oct. 18, 2022 for Application No. 201980029310.7.
Taiwan Office Action dated Oct. 5, 2022 for Application No. 111108483.
Chinese Office Action dated Nov. 7, 2022 for Application No. 202080046775.6.
Korean Office Action dated Dec. 19, 2022 for Application No. 10-2020-7035352.
Japanese Office Action dated Dec. 13, 2022, Application No. 2021-504252.
Chinese Office Action dated Aug. 31, 2022 in Application No. 201980055267.17, pages.
Chinese Office Action dated Dec. 22, 2022 in Application No. 201980055267.12, pages.
Japanese Office Action dated Apr. 18, 2022 in Application No. 2021-504252, 5 pages.
Japanese Office Action dated Aug. 9, 2022 in Application No. 2021-504252, 8 pages.
Japanese Office Action dated Dec. 13, 2022 in Application No. 2021-504252, 2 pages.
Korean Office Action dated Apr. 1, 2023 for Application No. 10-2021-7002909.
Chinese Office Action dated Sep. 3, 2021 for Application No. 201980029310.7.
Chinese Office Action dated Oct. 11, 2021 for Application No. 201880069545.4.
Chinese Office Action dated Feb. 24, 2023 for Application No. 202080046786.4.
Chinese Patent Application No. 201980055267.1, Office Action dated Mar. 11, 2023, 11 pages.
Korean Office Action dated Sep. 26, 2023 for Application No. 10-2021-7002909.
Japanese Application No. 2023-065758, Office Action dated Dec. 26, 2023, 9 pages.
Japanese Application No. 2021-504252, Office Action dated Feb. 6, 2024, 16 pages.

\* cited by examiner

MULTI-LAYER WET-DRY HARDCOATS FOR FLEXIBLE COVER LENS

CROSS-REFERENCE TO RELATED APPLICATIONS

This application claims the benefit of U.S. Provisional Patent Application Ser. No. 62/718,931, filed Aug. 14, 2018, which is herein incorporated by reference.

BACKGROUND

Field

Implementations described herein generally relate to flexible display devices, and more specifically to flexible cover lens.

Description of the Related Art

Electronic devices often have displays such as liquid crystal displays and organic light-emitting-diode displays. Such displays can be fragile and sensitive to moisture, pressure, or particle contamination. Generally, display devices use several layers of optical devices to colorize, polarize, and shutter light from an illumination source. To prevent damage to the underlying film, a rigid display cover lens layer is mounted over the other layers to prevent damage to the underlying layers. The inclusion of the rigid display cover lens can add undesirable weight to an electronic device. The cover lens can be omitted to reduce the size and weight of a device, but omitting the cover lens can make the display susceptible to damage from scratches.

At the present time, the increasing demands for new functionalities of products and exploiting new and broad applications call for thinner and lighter lens substrates with new properties such as flexibility. Broadly, three main characteristics are desired from a cover lens for these new flexible or foldable displays: 1) optical performance, 2) high hardness, and 3) flexibility. A cover lens having high optical performance ensures a high transmission of light with very little haze. High hardness relates to scratch and abrasion resistance. Flexibility in cover lenses is in terms of having a high enough critical strain that failure due to crack or delamination is avoided when repeatedly bent and folded.

Traditionally, while cover lenses made of glass have been excellent at addressing the first two characteristics (i.e. optical performance and hardness), they have been poor at the third characteristic, i.e. flexibility, due to the brittle nature of glass. To improve this, significant prior effort has gone into increasing the critical-strain at failure for glass, mainly by reducing the thickness of glass or chemical modification of the materials. Nonetheless, glass as a material for cover lenses has been found deficient to address the radius of curvature flexibility sought. Other materials, such as various metals, exist with high hardness and flexibility, but lack the optical performance required in terms of letting light pass through. Alternatively, materials exist with high transparency, optical properties, and flexibility, but have poor abrasion or scratch resistance, such as polymer-based films.

Therefore, there is a need for a flexible cover lens which has high hardness, optical transmission, elasticity, and anti-abrasion properties.

SUMMARY

Implementations described herein generally relate to flexible display devices, and more specifically to flexible cover lens films. The flexible cover lens film has improved strength, elasticity, optical transmission, and anti-abrasion properties. The flexible cover lens film comprises a multi-layer hardcoat disposed on a substrate layer. The substrate layer has a thickness between 2 μm to 100 μm, and the multi-layer hardcoat has a thickness between 1 μm to 10 μm. The multi-layer hardcoat comprises a first layer deposited using a wet deposition process, a second layer deposited using a dry deposition process, and one or more adhesion promotion layers. In terms of optical properties, the multi-layer hardcoat has a total transmission greater than 88%, a haze of about 1% or less, and a yellowness index of $b^*<1$. By combining wet and dry deposition processes to form the multi-layer hardcoat, the cover lens film is both flexible and strong with hardness between 4H and 9H.

In one implementation, a cover lens film comprises a substrate layer having a thickness between 2 μm to 100 μm and a multi-layer hardcoat disposed on the substrate layer. The multi-layer hardcoat comprises a first layer deposited using a wet deposition process, a second layer deposited using a dry deposition process, and an adhesion promotion layer. The multi-layer hardcoat has a thickness between 1 μm to 30 μm. The multi-layer hardcoat a total transmission greater than 88%, a haze of about 1% or less, and a yellowness index of $b^*<1$.

In another implementation, a cover lens film comprises a substrate layer having a thickness between 2 μm to 100 μm and a multi-layer hardcoat disposed on the substrate layer. The multi-layer hardcoat comprises a first layer deposited using a wet deposition process, a second layer deposited using a dry deposition process, a first adhesion promotion layer, and a second adhesion promotion layer. The multi-layer hardcoat has a thickness between 1 μm to 30 μm. The multi-layer hardcoat has a total transmission greater than 88%, a haze of about 1% or less, and a yellowness index of $b^*<1$.

In another implementation, a method of forming a cover lens film comprises depositing a multi-layer hardcoat on a substrate layer. The multi-layer hardcoat comprises a first layer deposited using a wet deposition process, a second layer deposited using a dry deposition process, and one or more adhesion promotion layers.

BRIEF DESCRIPTION OF THE DRAWINGS

So that the manner in which the above recited features of the disclosure can be understood in detail, a more particular description of the disclosure, briefly summarized above, may be had by reference to implementations, some of which are illustrated in the appended drawings. It is to be noted, however, that the appended drawings illustrate only typical implementations of this disclosure and are therefore not to be considered limiting of scope, for the disclosure may admit to other equally effective implementations.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Implementations described herein generally relate to flexible display devices, and more specifically to flexible cover lens films. The flexible cover lens film has improved strength, elasticity, optical transmission, and anti-abrasion properties. The flexible cover lens film comprises a multi-layer hardcoat disposed on a substrate layer. The substrate layer has a thickness between 2 μm to 100 μm, and the multi-layer hardcoat has a thickness between 1 μm to 10 μm. The multi-layer hardcoat comprises a first layer deposited using a wet deposition process, a second layer deposited using a dry deposition process, and one or more adhesion promotion layers. In terms of optical properties, the multi-layer hardcoat has a total transmission greater than 88%, a haze of about 1% or less, and a yellowness index of $b^*<1$. By combining wet and dry deposition processes to form the multi-layer hardcoat, the cover lens film is both flexible and strong with hardness between 4H and 9H.

Figure 1A:
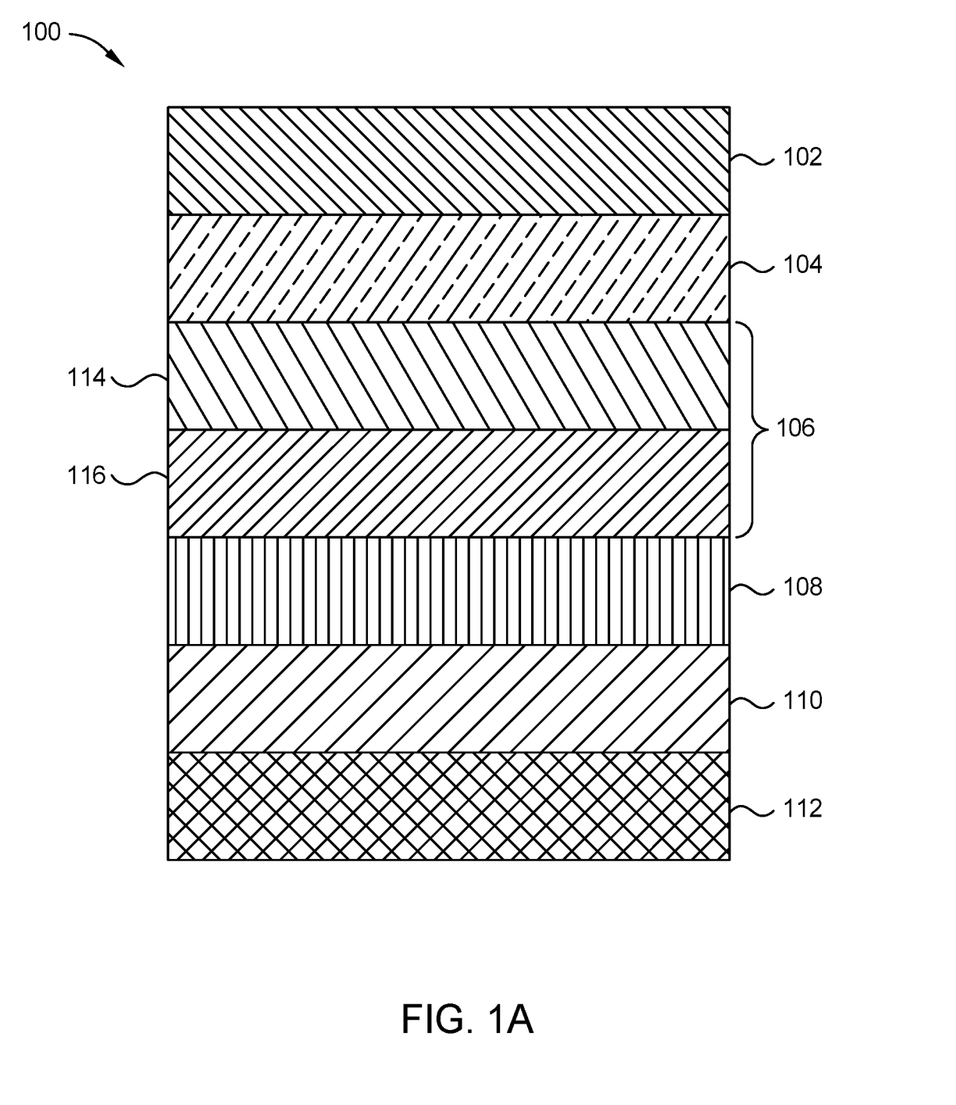
FIGS. 1A-1B illustrate schematic, cross-sectional views of display devices, according to various embodiments described herein.
Figure 1B:
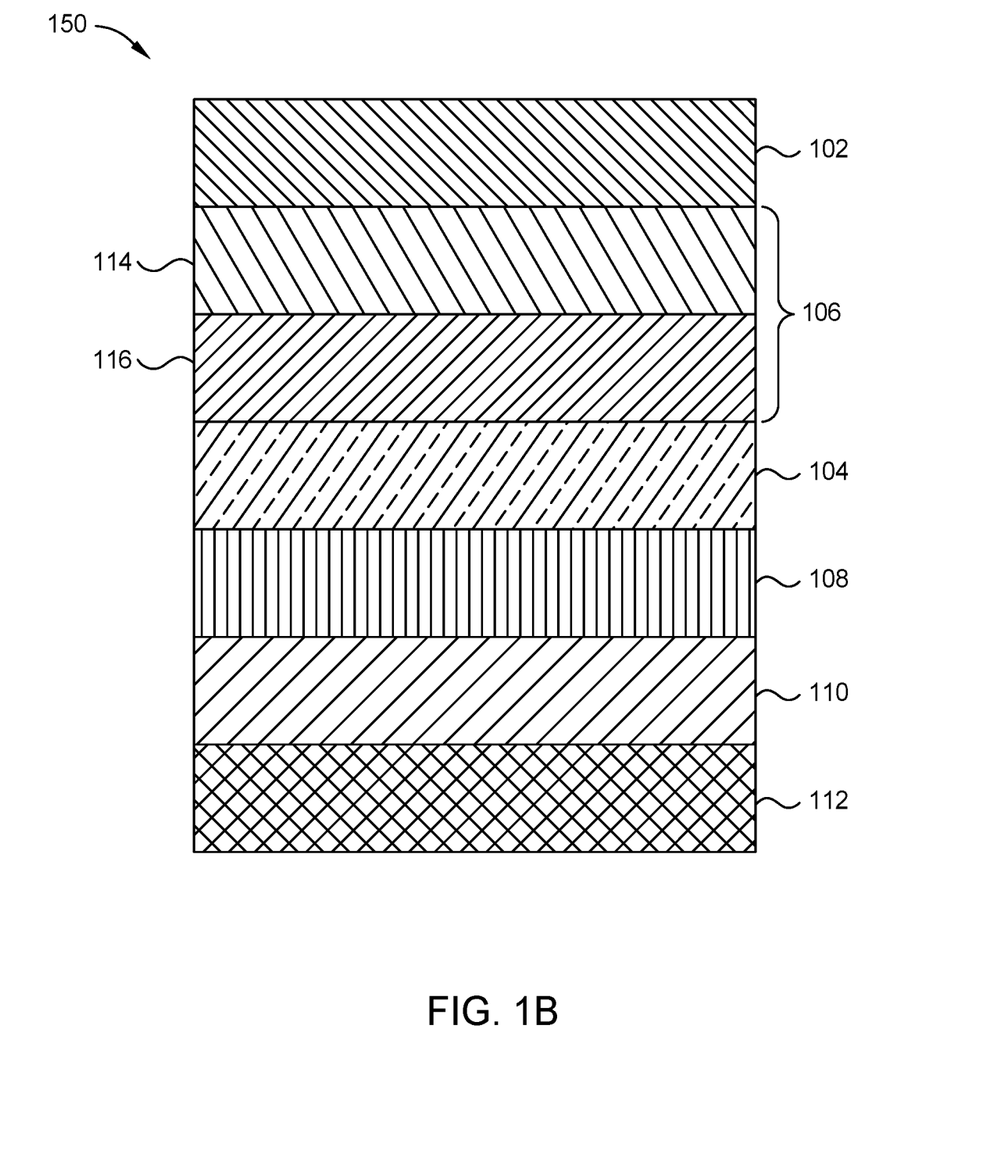

FIG. 1A shows a schematic, cross-sectional view of a display device 100 according to one implementation described herein. FIG. 1B shows a schematic, cross-sectional view of a display device 150 according to another implementation described herein. The display device 100 of FIG. 1A and the display device 150 of FIG. 1B comprise the same layers; however, the layers of each display device 100, 150 are in different orders. The display devices 100, 150 may be manufactured using plasma enhanced chemical vapor deposition, chemical vapor deposition, physical vapor deposition, atomic layer deposition, photo-lithography, etching, or other such suitable manufacturing processes. Suitable manufacturing devices may be purchased from Applied Materials, Inc. of Santa Clara, CA.

The display devices 100, 150 each include a cover lens film 102, a film layer 104, a touch panel 106, a display structure 108, a substrate 110, and a shielding layer 112. The cover lens film 102 may be bonded to a foldable glass substrate (e.g., ultra-thin glass). In the implementation of FIG. 1A, the film layer 104 is between the cover lens film 102 and the touch panel 106. In one implementation, the film layer 104 is a multi-function film layer including a polarizer film. The film layer 104, such as polarizer film, is used to reduce unwanted reflections due to the reflective metal that makes up the electrode lines or metallic structures within the display device 100. The film layer 104 may include a quarter-wave retarder or a linear polarizer formed from flexible lens film with a thickness of less than 0.2 mm. The cover lens film 102 may be bonded to the film layer 104 and the touch panel 106 with an optically clear adhesive (OCA). In one implementation, the OCA is liquid-based adhesive utilized to bond the cover lens film 102 to the touch panel 106. In another implementation, the OCA is an optically clear adhesive tape to bond the cover lens film 102 to the touch panel 106. The touch panel 106 includes a touch sensor IC board 114 and a touch sensor 116. In one implementation, the touch sensor IC board 114 is a flexible and metal base printed circuit board.

In the implementation of FIG. 1A, the display structure 108 is disposed between the touch panel 106 and substrate 110. In one implementation, the display structure 108 is an organic light-emitting diode display. However, other suitable display devices, such as light emitting diode displays or liquid crystal displays, which utilize a cover lens film, are contemplated herein. The display structure 108 may include a thin film encapsulation, organic emitting layer, driver IC board, and thin film transistor.

Alternatively, in FIG. 1B, the film layer 104 and the touch panel 106 may be layered on top of the display structure 108 such that the film layer 104 and the touch panel 106 are disposed between the display structure 108 and the cover lens film 102. In such an embodiment, the cover lens film 102 provides abrasion resistance and impact protection.

In one implementation, the substrate 110 is made from a polyimide material. However, any flexible plastic substrate may be utilized. For instance, the substrate may be a polyether ether ketone layer, transparent conductive polyester layer, polycarbonate, or any other polymer from the polyaryletherketone family. In the implementation of FIG. 1, the substrate 110 is adjacent the shielding layer 112. In one implementation the substrate 110 is polyester terephthalate. In one embodiment, the shielding layer 112 is a copper foil. An additional layer such as an adhesion promoting layer may be deposited adjacent to the substrate 110 prior to any additional layers, such as the shielding layer 112.

FIGS. 2A-2E illustrate a schematic, cross-sectional view of a flexible cover lens film 200, 220, 230, 240, 250, respectively, according to various embodiments. Each of the flexible cover lens films 200, 220, 230, 240, 250 may be the cover lens film 102 of FIG. 1. The flexible cover lens films 200, 220, 230, 240, 250 may be utilized in a display device, such as display device 100 of FIG. 1A and/or the display device 150 of FIG. 1B. Each of the flexible cover lens films 200, 220, 230, 240, 250 comprise a substrate layer 202, one or more adhesion promotion layers 206, a first layer 204 deposited using a wet deposition process, and a second layer 208 deposited using a dry deposition process. A wet deposition process may include a solution comprising solvent and hardcoat chemistry deposited using a slot-die coating head, gravure coating head, or bar coating heads in roll to roll solution processing system. The deposited solution is then cured using ultra-violet radiation and/or thermal method.

A dry deposition process may include chemical vapor deposition (CVD), plasma enhanced chemical vapor deposition (PECVD), atomic layer deposition (ALD), physical vapor deposition (PVD), thermal evaporation, electron beam evaporation, etc. The dry deposition process may optionally be enhanced with a plasma, and may be processed in sheet-to-sheet equipment or roll-to-roll equipment. The dry deposition process can be performed in sufficiently equipped sheet processing equipment in which a carrier glass sheet is loaded with the substrate layer 202 containing the first layer 204 for some implementations. For implementations, the substrate layer 202 may be directly loaded on to the carrier glass sheet or bonded to slimmed or ultra-thin glass substrate which in-turn may be loaded on the carrier for dry deposition processing.

Figure 2A:
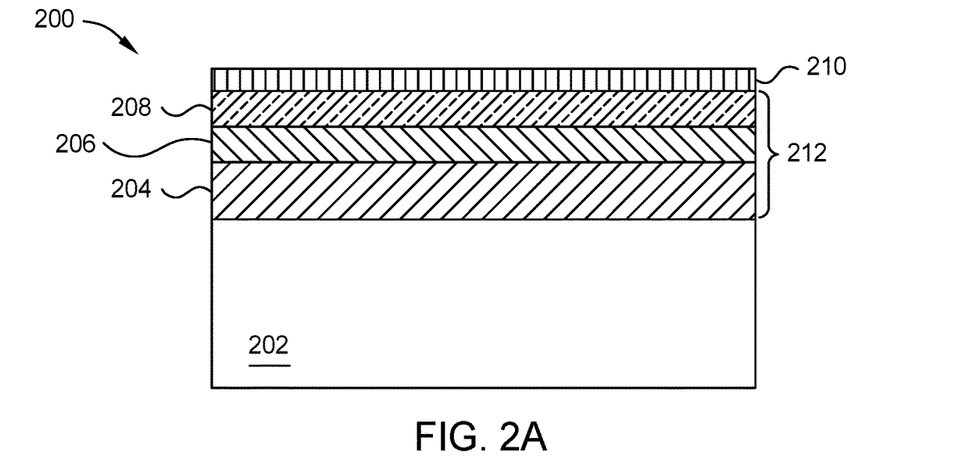
FIGS. 2A-2E illustrate schematic, cross-sectional view of cover lens films according to various embodiments described herein.

In the embodiment of FIG. 2A, the flexible cover lens film 200 comprises a first layer 204, which is deposited using a wet deposition process, deposited on a substrate layer 202. An adhesion promotion layer 206 is deposited on the first layer 204. A second layer 208, which is deposited using a dry deposition process, is deposited on the adhesion promotion layer 206. The first layer 204, the adhesion promotion layer 206, and the second layer 208 form a multi-layer hardcoat 212. An anti-smudge layer 210 is deposited on the second layer 208. The anti-smudge layer 210 may be an anti-fingerprint layer. The anti-smudge layer 210 may be deposited using a dry deposition process or a wet deposition process.

Figure 2B:
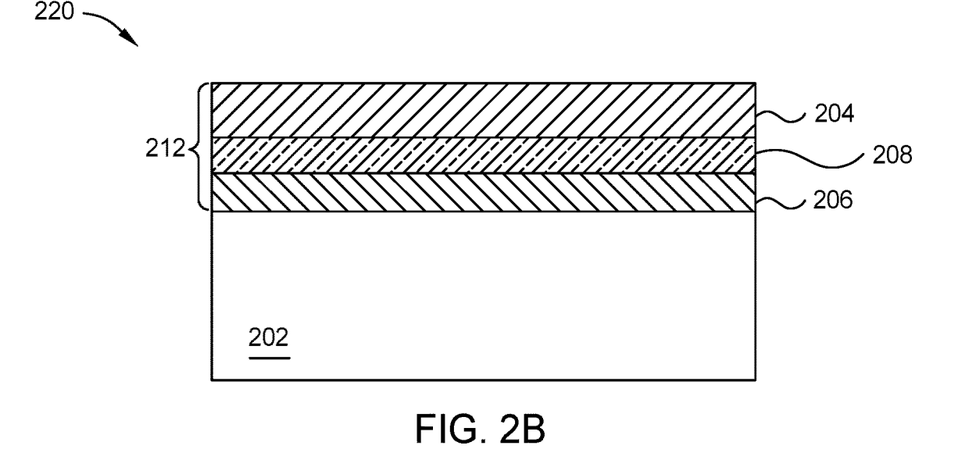

In the embodiment of FIG. 2B, the flexible cover lens film 220 comprises the adhesion promotion layer 206 deposited on the substrate layer 202. The adhesion promotion layer 206 may be deposited using a dry vacuum deposition process, such as CVD, PECVD, ALD, PVD, thermal evaporation, electron beam evaporation, etc., or using a wet deposition process. The second layer 208, which is deposited using a dry deposition process, is deposited on the adhesion promotion layer 206. The first layer 204, which is deposited using a wet deposition process, is deposited on the second layer 208. In one embodiment, the first layer 204 comprises an anti-smudge or anti-fingerprint additive. In another embodiment, an anti-smudge layer (not shown) is deposited on the first layer 204, and the anti-smudge layer 210 may be deposited using a dry deposition process or a wet deposition process. The first layer 204, the adhesion promotion layer 206, and the second layer 208 form a multi-layer hardcoat 212.

Figure 2C:
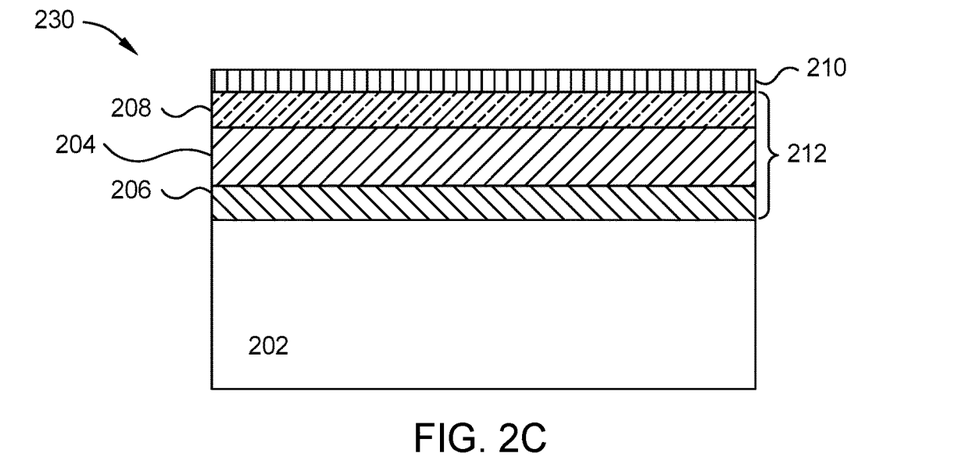

In the embodiment of FIG. 2C, the flexible cover lens film 230 comprises the adhesion promotion layer 206 deposited on the substrate layer 202. The first layer 204, which is deposited using a wet deposition process, is deposited on the adhesion promotion layer 206. The second layer 208, which is deposited using a dry deposition process, is deposited on the first layer 204. The first layer 204, the adhesion promotion layer 206, and the second layer 208 form a multi-layer hardcoat 212. An anti-smudge layer 210 is deposited on the second layer 208. The anti-smudge layer 210 may be deposited using a dry deposition process or a wet deposition process.

Figure 2D:
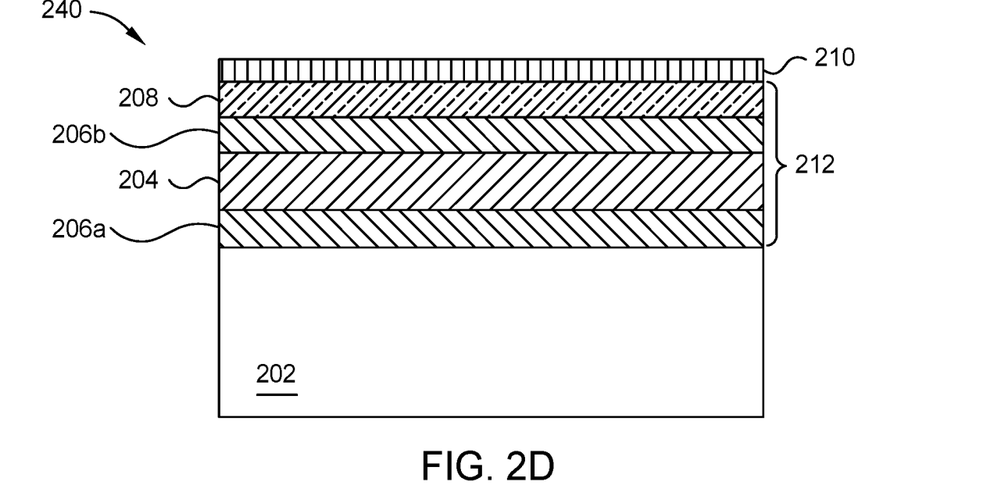

In the embodiment of FIG. 2D, the flexible cover lens film 240 comprises a first adhesion promotion layer 206a deposited on the substrate layer 202. The first layer 204, which is deposited using a wet deposition process, is deposited on the first adhesion promotion layer 206a. A second adhesion promotion layer 206b is deposited on the first layer 204. The second layer 208, which is deposited using a dry deposition process, is deposited on the second adhesion promotion layer 206b. The first adhesion promotion layer 206a, the first layer 204, the second adhesion promotion layer 206b, and the second layer 208 form a multi-layer hardcoat 212. An anti-smudge layer 210 is deposited on the second layer 208. The anti-smudge layer 210 may be deposited using a dry deposition process or a wet deposition process.

Figure 2E:
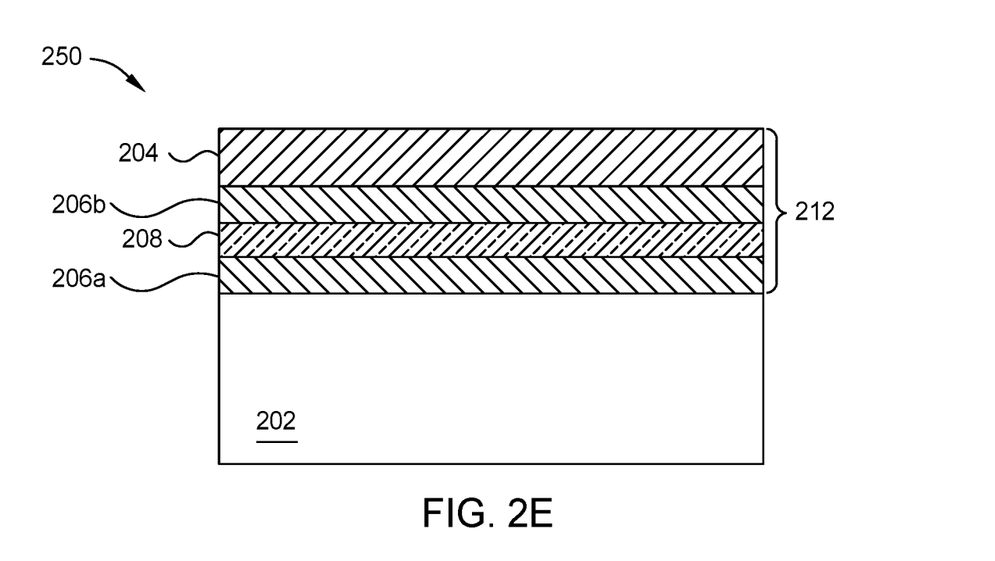

In the embodiment of FIG. 2E, the flexible cover lens film 250 comprises the first adhesion promotion layer 206a deposited on the substrate layer 202. The second layer 208, which is deposited using the dry deposition process, is deposited on the first adhesion promotion layer 206a. The second adhesion promotion layer 206b is deposited on the second layer 208. The first layer 204, which is deposited using the wet deposition process, is deposited on the second adhesion promotion layer 206b. In one embodiment, the first layer 204 comprises an anti-smudge additive. In another embodiment, an anti-smudge layer (not shown) is deposited on the first layer 204, and the anti-smudge layer 210 may be deposited using a dry deposition process or a wet deposition process. The first adhesion promotion layer 206a, the second layer 208, the second adhesion promotion layer 206b, and the first layer 204 form a multi-layer hardcoat 212.

The flexible cover lens films 200, 220, 230, 240, 250 of FIGS. 2A-2E have a pencil hardness between 4H and 9H, a total transmission greater than 88%, a haze of about 1% or less, and a yellowness index of $b^* < 1$. In one embodiment, the flexible cover lens films 200, 220, 230, 240, 250 have a pencil hardness of 9H, a total transmission greater than 92%, and a haze of 0.5%. The flexible cover lens films 200, 220, 230, 240, 250 have flexibility over repeated cycles to bend to up to 1 mm inside-radius of curvature or up to 2 mm out-side radius of curvature. The flexible cover lens films 200, 220, 230, 240, 250 have a scratch resistance as measured by a standard steel wool test loaded up to 1 kg and able to withstand a large number of cycles, for example 2000 cycles. The change in haze of the flexible cover lens films 200, 220, 230, 240, 250 after a steel wool abrasion test is less than 1%, demonstrating that the flexible cover lens films 200, 220, 230, 240, 250 each have a high abrasion resistance. The flexible cover lens films 200, 220, 230, 240, 250 have an abrasion resistance as measured by a Taber abrasion resistance test loaded up to 1 kg and able to withstand a large number of cycles, for example 100 cycles. The change in haze of the flexible cover lens films 200, 220, 230, 240, 250 after a Taber abrasion resistance test is less than 2%.

In FIGS. 2A-2E, the first layer 204 may be deposited using a roll to roll solution processing method. The second layer 208 may be deposited using CVD, PVD, PECVD, or ALD. In one embodiment, the second layer 208 may be deposited using CVD. The multi-layer hardcoat 212 may have a thickness between 1 μm to 30 μm. In one embodiment, the multi-layer hardcoat 212 has a thickness between 5 μm to 10 μm.

In FIGS. 2A-2E, the first layer 204 may include one or more materials selected from the group consisting of urethane acrylate chemistry, solgel-siloxane hybrids with or without silica nanoparticles, or a combination thereof. Hybrid siloxanes may comprise organic and inorganic elements, including metal alkoxides. The first layer 204, which is deposited using a wet deposition process, may further include one or more materials selected from radiation curable acrylates, aliphatic urethane acrylates, copolymers thereof, elastomers thereof, and a combination thereof. The first layer 204 may have a thickness between about 0.5 μm to about 40 μm. The first layer 204 may have a refractive index of about 1.430 to about 1.150, an optical transmission of about 85% to about 98%, and a pencil hardness of about 2H to about 9H. The first layer 204 may have a nano-indentation hardness of about 0.5 GPa to about 1.5 GPa or an elastic modulus raging from about 5 Gpa to about 13 GPa as measured by nano-indentation.

The wet deposition process for depositing the first layer 204 may comprise applying a chemistry solution using various Mayer rods, heating in a non-active convection oven between 75° C. and 85° C. for between 100 seconds and 140 seconds, and irradiating with a UV lamp for between 100 seconds and 140 seconds at between 300 mJ/cm2 and 500 mJ/cm2. The solution of the wet deposition process may be processed ion atmosphere by bar, slot-die coating, gravure coating, or cast. In one implementation, the deposited solution of the wet deposition process is cured using ultraviolet radiation. In another implementation, the deposited solution of the wet deposition process is cured using an electron beam processing.

The second layer 208 may include one or more materials selected from the group consisting of oxides and nitrides of silicon, silicon oxycarbides ($SiC_xO_y$), silicon oxynitrides, and silicon carbide (SiC). The second layer 208 may have a thickness between about 0.05 μm to about 30 μm. Precursors used in the dry deposition process may include organic polymer precursors (liquid or gas) with carbon, such as one or more of hexamethyldisiloxane (HMDSO), plasmapolymerized HMDSO (ppHMDSO), tetramethyl cyclotetrasiloxane (TOMCAT), hexamethyldisilazane (HMDSN), or tetraethyl orthosilicate (TEOS). Precursors used in the dry deposition process may further include sputtering various silica or quartz to deposit various carbon-mixed oxides or nitrides of silicon or precursors without carbon present, such as silane (SiH4).

The second layer 208 may have a refractive index of about 1.450 to about 1.150, an optical transmission of about 85% to about 98%, and a pencil hardness of about 2H to about 9H. The second layer 208 may have a nano-indentation hardness of about 1 GPa to about 8 GPa or an elastic modulus raging from about 5 Gpa to about 70 GPa as measured by nano-indentation. The second layer 208 may have a high hardness controlled by the oxidizers or initiators to precursor ratio, such as oxygen ($O_2$), nitrous oxide ($N_2O$), tert-butyl peroxide (TBPO), or acrylate monomers, particularly ethyl-hexyl acrylate, and/or cross linking agents such as butanediol-diacrylate (BDDA) to minimize the carbon present in the second layer 208.

The substrate layer 202 of FIGS. 2A-2E has a thickness between 2 μm to 100 μm. The substrate layer 202 includes a material selected from the group consisting of polyethylene terephthalate, triacetylcellulose, polycarbonate, polyamides, polymethacrylic acid methylesther, cycloolefin polymer, polyethylene napthalene (PEN), and colorless polyimides (CPI). In one embodiment, the substrate layer 202 has a thickness of about 25 μm to 50 μm, and is a CPI layer. The anti-smudge layer 210 is an oleophobic film. The anti-smudge layer 210 may be a perfluoropolyether (PFPE) based silane polymer molecule (e.g., various chlorosilanes, oxysilanes, fluoroethylenes, etc.) covalently bonded to the surface of the layer below. The anti-smudge layer may be wet or vacuum-dry coated. The anti-smudge layer 210 may have a thickness between 3 nm and 50 nm.

The one or more adhesion promotion layers 206 may have a thickness between 50 nm and 1500 nm. The one or more adhesion promotion layers 206 may be deposited using a dry deposition process, and may be comprised of oxides and nitrides of silicon, silicon oxycarbides, or silicon oxynitrides. Precursors used in the dry deposition process may include organic polymer precursors (liquid or gas) with carbon, such as one or more of HMDSO, ppHMDSO, TOMCAT, HMDSN, or TEOS. Precursors used in the dry deposition process may further include sputtering various silica or quartz to deposit various carbon-mixed oxides or nitrides of silicon.

The one or more adhesion promotion layers 206 may also be deposited in a wet deposition process, and may include one or more polymeric or oligomeric materials, such as acrylate, silicone, or optically clear adhesives (OCA). In one or more examples, the one or more adhesion promotion layers 206 deposited using a wet deposition process may also be formed from a liquid optically clear adhesive (LOCA) that can be dispensed in various ways (e.g., Mayer rods, slot dies, gravure heads, bar coaters, etc.) and cured by UV exposure, or be heat, moisture, and/or pressure sensitive and be cured by adjusting or controlling the same.

Each of the one or more adhesion promotion layers 206 may have a refractive index of about 1.430 to about 1.150 and an optical transmission of about 85% to about 98%. Each of the one or more adhesion promotion layers 206 may have a nano-indentation hardness of about 0.4 GPa to about 5 GPa or an elastic modulus raging from about 2.5 Gpa to about 70 GPa as measured by nano-indentation. Each of the one or more adhesion promotion layers 206 may have a high hardness controlled by the oxidizers or initiators to precursor ratio, such as $O_2$, $N_2O$, TBPO, or acrylate monomers, particularly ethyl-hexyl acrylate, and/or cross linking agents such as BDDA to accurately control the carbon present.

One or more of the flexible cover lens films 200, 220, 230, 240, 250 may be stacked on each other. For example, the flexible cover lens film 200 may be stacked on the flexible cover lens film 220, or the flexible cover lens film 200 may double such that there are two flexible cover lens films 200. Additionally, the multi-layer hardcoat 212 may be stacked one or more times on the substrate layer 202. The one or more flexible cover lens films 200, 220, 230, 240, 250 or stacked multi-layer hardcoats 212 may be independently be adhered, bonded, or otherwise held together by one or more adhesives, such as with one or more OCA. The one or more flexible cover lens films 200, 220, 230, 240, 250 or stacked multi-layer hardcoats 212 may be independently be adhered, bonded, or otherwise held together without the use of adhesives.

Figure 3:
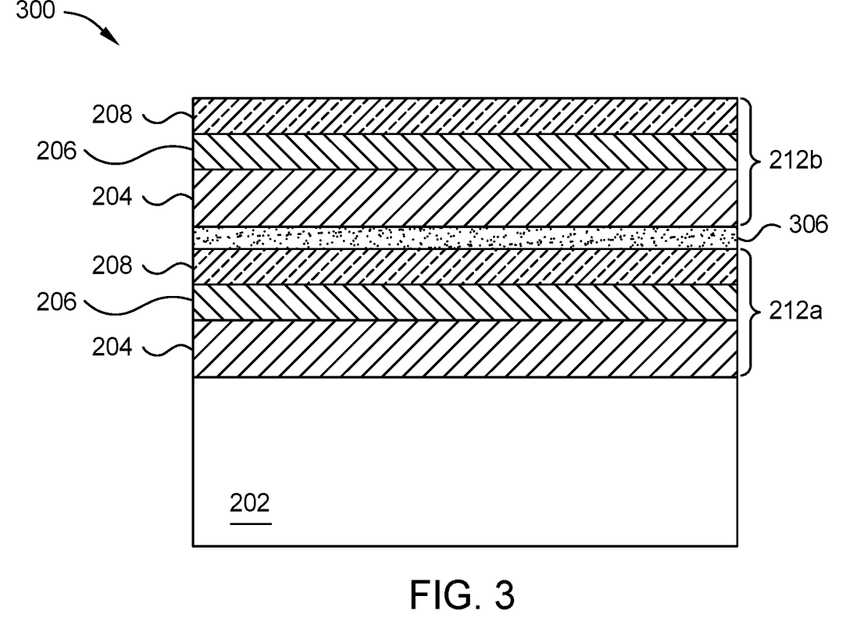
FIG. 3 illustrates an exemplary embodiment of a flexible cover lens film comprised of a double stacked multi-layer hardcoat, according to an embodiment disclosed herein.

FIG. 3 illustrates an exemplary embodiment of a flexible cover lens film 300 comprised of a double stacked multi-layer hardcoat of the flexible cover lens film 200. In the flexible cover lens film 300, a first multi-layer hardcoat 212a is disposed on the substrate layer 202 and a second multi-layer hardcoat 212b is disposed on the first multi-layer hardcoat 212a. One or more adhesive layers 306 are disposed between the first multi-layer hardcoat 212a and the second multi-layer hardcoat 212b. The one or more adhesive layers 306 may be sacrificial adhesive layers. The one or more adhesive layers 306 may be the one or more adhesion promotion layers 206 of FIGS. 2A-2E. Both the first and second multi-layer hardcoat 212a, 212b comprise the first layer 204, the adhesive promotion layer 206 disposed on the first layer 204, and the second layer 208 disposed on the adhesive promotion layer 206. The anti-smudge layer 210 may be deposited on the second multi-layer hardcoat 212b.

If it is desirable to remove and replace the top-most flexible cover lens films (e.g., due to being scratched or suffering other damage), such as the second multi-layer hardcoat 212b of FIG. 3, the one or more adhesive layers, such as the adhesive layer 306, can be selectively degraded, destroyed, or otherwise removed in order to separate the top cover lens (e.g. the second multi-layer hardcoat 212b of FIG. 3) from the bottom cover lens film (e.g., the first multi-layer hardcoat 212a of FIG. 3). The adhesives (e.g., the adhesive layers 306 of FIG. 3) bonding the two stacks of cover films can be degraded at a predetermined temperature, a predetermined wavelength and/or dosage of ultraviolet (UV) light, and/or a predetermined mechanical removal mechanism.

In some examples, the sacrificial adhesives (e.g., the adhesive layers 306 of FIG. 3) bonding two stacked flexible cover lens films (e.g., the first and second multi-layer hardcoat 212a, 212b of FIG. 3) may be degradable at a predetermined temperature. For example, the adhesives may be degradable a temperature of about 80° C., about 90° C., or about 100° C. to about 120° C. In other examples, the sacrificial adhesives are degradable when exposed to UV light at a predetermined wavelength and/or predetermined dosage. For example, the adhesives are degradable when exposed to UV light having a wavelength of about 350 nm to about 375 nm, such as about 365 nm. The adhesives may be degraded by exposing the adhesive to the UV light for a period of about 0.5 seconds, about 1 second, or about 5 seconds to about 30 seconds, about 60 seconds, or about 90 seconds.

A method of forming the flexible cover lens films 200, 220, 230, 240, 250 may comprise positioning the substrate layer 202 and depositing the multi-layer hardcoat 212 on the substrate layer 202. The layers 204-208 of the multi-layer hardcoat 212 may be deposited using both wet and dry deposition processes, such as CVD, PVD, atmospheric solution processing methods in sheet-to-sheet processing equipment, and/or roll to roll equipment. Furthermore, it is contemplated that additional layers may be present in the flexible cover lens films 200, 220, 230, 240, 250, such as additional adhesion promotion layers or impact resistance layers. The cover lens films described herein may be used in any display device.

Combining wet and dry deposition processes to form the multi-layer hardcoat results in an optically clear, high hardness, bendable cover lens film. The combination of dry films and wet films enhances anti-abrasion properties and elasticity of the cover lens film while allowing for an anti-smudge layer to be deposited on top of the multi-layer hardcoat. By combining wet and dry deposition processes to form the multi-layer hardcoat, the cover lens films have improved elasticity, strength, optical transmission, wear resistance, anti-abrasion properties, and thermostability.

While the foregoing is directed to implementations of the disclosure, other and further implementations may be devised without departing from the basic scope thereof, and the scope thereof is determined by the claims that follow.

What is claimed is:

1. A cover lens film, comprising:
 a substrate layer having a thickness between 2 μm to 100 μm; and
 a multi-layer hardcoat disposed on the substrate layer, wherein the multi-layer hardcoat comprises a first layer deposited on a second layer using a wet deposition process, the second layer deposited on an adhesion promotion layer using a dry deposition process, and the adhesion promotion layer deposited on the substrate layer, wherein the multi-layer hardcoat has a thickness between 1 μm to 30 μm, wherein the multi-layer hardcoat has a total optical transmission greater than 88%, a haze of about 1% or less, and a yellowness index of b*<1, and wherein the first layer has a nano-indentation hardness of about 0.5 GPa to about 1.5 GPa, and the second layer has a nano-indentation hardness of about 1 GPa to about 8 GPa, and wherein the cover lens film has a flexibility to bend to a 1 mm inside radius of curvature or to a 2 mm outside radius of curvature.

2. The cover lens film of claim 1, wherein an anti-smudge layer is deposited on the first layer.

3. The cover lens film of claim 1, wherein the multi-layer hardcoat has a high abrasion resistance and a change in haze after a steel wool abrasion test of less than 1%.

4. The cover lens film of claim 1, wherein the multi-layer hardcoat has a pencil hardness of about 4H to about 9H.

5. The cover lens film of claim 1, wherein the first layer comprises a material selected from the group consisting of urethane acrylate chemistry, solgel-siloxane hybrids with or without silica nanoparticles, or a combination thereof.

6. The cover lens film of claim 1, wherein the second layer comprises a material selected from the group consisting of oxides and nitrides of silicon, silicon oxycarbides, silicon oxynitrides, and silicon carbide.

7. The cover lens film of claim 1, wherein the first layer has an elastic modulus between about 5 GPa to about 13 GPa, and the second layer has an elastic modulus between about 5 GPa to about 70 GPa.

8. The cover lens film of claim 1, wherein the multi-layer hardcoat has a thickness between 5 μm to 10 μm.

9. A cover lens film, comprising:
 a substrate layer having a thickness between 2 μm to 100 μm; and
 a multi-layer hardcoat disposed on the substrate layer, wherein the multi-layer hardcoat comprises a first layer deposited on a first adhesion promotion layer using a wet deposition process, a second layer deposited on a second adhesion promotion layer using a dry deposition process, the second adhesion promotion layer deposited on the substrate layer, and the first adhesion promotion layer deposited on the second layer, wherein the multi-layer hardcoat has a thickness between 1 μm to 30 μm, wherein the multi-layer hardcoat has a total optical transmission greater than 88%, a haze of about 1% or less, and a yellowness index of b*<1, and wherein the first layer has a nano-indentation hardness of about 0.5 GPa to about 1.5 GPa, and the second layer has a nano-indentation hardness of about 1 GPa to about 8 GPa, and wherein the cover lens film has a flexibility to bend to a 1 mm inside radius of curvature or to 2 mm outside radius of curvature.

10. The cover lens film of claim 9, wherein an anti-smudge layer is deposited on the multi-layer hardcoat.

11. The cover lens film of claim 9, wherein the first layer has an elastic modulus between about 5 GPa to about 13 GPa, and the second layer has an elastic modulus between about 5 GPa to about 70 GPa.

12. A cover lens film, comprising:
 a substrate layer having a thickness between 2 μm to 100 μm; and
 a multi-layer hardcoat disposed on the substrate layer, wherein the multi-layer hardcoat comprises a first layer deposited on a second layer using a wet deposition process, the second layer deposited on a first adhesion promotion layer using a dry deposition process, and the first adhesion promotion layer deposited on the substrate layer, wherein the multi-layer hardcoat has a thickness between 1 μm to 30 μm, wherein the multi-layer hardcoat has a total optical transmission greater than 88%, a haze of about 1% or less, and a yellowness index of b*<1.

13. The cover lens of claim 12, further comprising a second adhesion promotion layer.

14. The cover lens of claim 13, wherein the first adhesion promotion layer is deposited on the substrate layer, the second layer is deposited on the first adhesion promotion layer, the second adhesion promotion layer is deposited on the second layer, and the first layer is deposited on the second adhesion promotion layer.

* * * * *